(12) United States Patent
Habu et al.

(10) Patent No.: US 8,048,493 B2
(45) Date of Patent: Nov. 1, 2011

(54) METHOD OF FORMING PIEZOELECTRIC RESIN FILM

(75) Inventors: Takeshi Habu, Hachioji (JP); Takayuki Sasaki, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 160 days.

(21) Appl. No.: 11/823,906

(22) Filed: Jun. 29, 2007

(65) Prior Publication Data
US 2008/0008825 A1  Jan. 10, 2008

(30) Foreign Application Priority Data
Jul. 10, 2006  (JP) .................... 2006-189092

(51) Int. Cl.
*H05H 1/00*  (2006.01)

(52) U.S. Cl. ........ 427/533; 528/310; 528/332; 528/335; 528/336; 528/347

(58) Field of Classification Search .............. 427/533; 528/310, 332, 335, 336, 347
See application file for complete search history.

(56) References Cited

U.S. PATENT DOCUMENTS

| | | | | |
|---|---|---|---|---|
| 4,710,553 A | * | 12/1987 | Carbonaro et al. | 526/142 |
| 4,742,141 A | * | 5/1988 | Dien et al. | 526/262 |
| 5,376,857 A | * | 12/1994 | Takeuchi et al. | 310/328 |
| 6,124,060 A | * | 9/2000 | Akita et al. | 429/307 |
| 6,478,412 B1 | * | 11/2002 | Hanabata | 347/71 |
| 7,038,006 B2 | * | 5/2006 | Ogawa et al. | 528/310 |
| 7,160,607 B2 | * | 1/2007 | Tanimoto | 428/297.4 |
| 2001/0015103 A1 | * | 8/2001 | Tabota et al. | 73/514.16 |
| 2001/0054859 A1 | * | 12/2001 | Hammer et al. | 310/363 |
| 2004/0000661 A1 | * | 1/2004 | Sato | 252/299.01 |
| 2004/0055128 A1 | * | 3/2004 | Yun et al. | 29/25.35 |
| 2004/0068090 A1 | * | 4/2004 | Ogawa et al. | 528/335 |

FOREIGN PATENT DOCUMENTS

| JP | 07-258370 A | 10/1995 |
|---|---|---|
| JP | 2006-063393 A | 3/2006 |

* cited by examiner

*Primary Examiner* — David Turocy
*Assistant Examiner* — Xiao Zhao
(74) *Attorney, Agent, or Firm* — Holtz, Holtz, Goodman & Chick, PC

(57) ABSTRACT

An objective is to provide a method of forming a piezoelectric resin film produced at low cost, and specifically to provide the method in which a large-area piezoelectric resin film is produced at low cost, and at reduced investment in facilities. Disclosed is a method of forming a piezoelectric resin film possessing the steps of polymerizing a monomer at a temperature of 5-60° C. to obtain a resin having a polymerization degree of 4-300, and a polarity group possessing one bond selected from a urea bond, an ester bond, an amide bond and an imide bond, coating the resin onto a substrate; and further polymerizing the resin at 70-250° C. while conducting a poling treatment.

4 Claims, No Drawings

METHOD OF FORMING PIEZOELECTRIC RESIN FILM

This application claims priority from Japanese Patent Application No. 2006-189092 filed on Jul. 10, 2006, which is incorporated hereinto by reference.

TECHNICAL FIELD

The present invention relates to a method of forming a piezoelectric resin film utilized for electric insulation and corrosion protection, and specifically to the method in which a large-area piezoelectric resin film is produced at low cost, and at reduced investment in facilities.

BACKGROUND

As a method of forming piezoelectric resin film, commonly known is a so called co-evaporation method in which a polyurea film is formed by simultaneously evaporating a diisocyanate compound such as 4,4'-diphenylmethane diisocyanate (MDI) and a diamine compound such as 4,4'-diaminodiphenyl methane (MDA), for example (refer to Patent Document 1).

However, there is a problem such that a monomer composition ratio in the resulting polyurea film differs from a stoichiometric composition ratio because of a different evaporation temperature of each monomer, since the polyurea film is arranged to be formed by simultaneously evaporating two kind of monomers of diisocyanate compound and a diamine compound in the case of the foregoing conventional technique, and evaporation has to be done while controlling temperature after setting the temperature of each of monomers separately. Also disclosed is reaction with water after limiting a monomer to only diisocyanate in order to avoid this temperature control (refer to Patent Document 2), but there is a drawback of limiting monomer selection. On the other hand, in the case of evaporation polymerization, it takes a long time to form a thick evaporation film, and there is another problem such that a vacuum system is required to produce a large-area piezoelectric film, and as a result, investment in facilities becomes large.

(Patent Document 1) Japanese Patent O.P.I. Publication No. 7-258370
(Patent Document 2) Japanese Patent O.P.I. Publication No. 2006-063393

SUMMARY

The present invention was made on the basis of the above-described situation. It is an object of the present invention to provide a method of forming a piezoelectric resin film produced at low cost, and specifically to provide the method in which a large-area piezoelectric resin film is produced at low cost, and at reduced investment in facilities. Also disclosed is a method of forming a piezoelectric resin film comprising the steps of polymerizing a monomer at a temperature of 5-60° C. to obtain a resin having a polymerization degree of 4-300, and a polarity group comprising one bond selected from a urea bond, an ester bond, an amide bond and an imide bond, coating the resin onto a substrate; and further polymerizing the resin at 70-250° C. while conducting a poling treatment.

DESCRIPTION OF THE PREFERRED EMBODIMENTS

The above object of the present invention is accomplished by the following structures.

(Structure 1) A method of forming a piezoelectric resin film comprising the steps of polymerizing a monomer at a temperature of 5-60° C. to obtain a resin having a polymerization degree of 4-300, and a polarity group comprising one bond selected from a urea bond, an ester bond, an amide bond and an imide bond, coating the resin onto a substrate; and further polymerizing the resin at 70-250° C. while conducting a poling treatment.

(Structure 2) The method of Structure 1, wherein the monomer is a diisocyanate compound, or a mixture of a diisocyanate compound and a diamine compound.

(Structure 3) The method of Structure 1 or 2, wherein the poling treatment is a dc pulse discharge treatment or a high-voltage corona discharge treatment.

(Structure 4) The method of any one of Structures 1-3, wherein the substrate is a piezoelectric ceramic plate.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

The preferred embodiments of the present invention will be described below, but the present invention is not limited thereto.

It is a feature in the method of forming a piezoelectric resin film of the present invention that the method comprises the steps of polymerizing a monomer at a temperature of 5-60° C. to obtain a resin having a polymerization degree of 4-300, and a polarity group comprising one bond selected from a urea bond, an ester bond, an amide bond and an imide bond, coating the resin onto a substrate; and further polymerizing the resin at 70-250° C. while conducting a poling treatment.

In order to polymerize the previously synthesized resin (prepolymer) of the present invention, it is desired to conduct polymerization at not higher than 60° C., and preferably at 5-35° C. The low temperature is accepted since the high polymerization degree is not preferred, but in the case of the temperature being too low, it is not preferred that a cooling system and electric power consumed by the cooling system are necessary. In the case of a temperature of at least 60° C., it is not also preferred that coating becomes difficult since polymerization is progressed, and viscosity is increased, whereby dissolved solvents are to be limited. Reaction time, depending on the reaction amount and temperature, should be adjusted appropriately, but the shorter reaction time is preferable in view of productivity.

The previously synthesized resin (prepolymer) of the present invention has a polymerization of 4-300, and preferably has a polymerization degree of 6-200. A polymerization degree of at least 4 is preferable since a liquid property together with excellent coatability can be obtained, so that an effect of even coating is produced. A polymerization degree of at most 300 is also preferable since an effect of having excellent solubility to a solvent is produced.

In order to coat the previously synthesized resin onto a substrate, and further polymerize it, polymerization is desired to be conducted at 70-250° C., and preferably at 80-200° C. while conducting a poling treatment. A temperature of at least 70° C. is preferable since an effect of controlling polymerization to desirably progress the polymerization is produced. A temperature of at most 250° C. is also preferable since an effect of being able to inhibit a drastic progress of polymerization as well as depolymerization is produced.

The method of forming a piezoelectric resin film of the present invention as described above is a method in which a monomer is previously polymerized for low molecular weight at low temperature; this low molecular weight polymer (prepolymer) is coated onto a substrate to conduct a corona discharge poling treatment at high temperature during a drying process; and a poling treatment, together with polymerization with a higher polymerization degree is conducted.

The piezoelectric resin usable in the present invention is a resin having a urea group, an ester group, an amide group, an imide group or a sulfonyl group as a polarity group, and a urea resin, an ester resin, an amide resin and an imide resin are usable.

A specifically preferable resin is a urea resin having a urea group, and utilized is a prepolymer in which low molecular weight polymerization of only a diisocyanate compound, or a diisocyanate compound and diamine compound as the monomer is first conducted.

A diisocyanate compound is usable as the monomer by mixing one kind or at least two kinds of 4,4'-methylenediphenyl diisocyanate, 3,3'-dimethyl diphenyl-4,4'-diisocyanate, o-dianisidine diisocyanate, methylene bis(4-isocyanate-3-methylbenzene), methylene bis(4-isocyanate-2-methylbenzene), methylene bis(o-chlorophenyl isocyanate), 5-chloro-2,4-toluene diisocyanate, 4,4'-diphenylmethane diisocyanate (MDI), 2,4-toluene diisocyanate (2,4-TDI), 2,6-toluene diisocyanate (2,6-TDI), 3,5-diisocyanate benzotrifluoride, bis(4-isocyanate phenyl)ether, dicyclohexyl methane-4,4'-diisocyanate, norbornane diisocyanate methyl, p-phenylene diisocyanate, p-xylene diisocyanate, tetramethyl xylene diisocyanate, 1,5-naphthalene diisocyanate, 2,6-naphthalene diisocyanate, trans-1,4-cyclohexyl diisocyanate, isophorone diisocyanate, 1,3-bis(isocyanate methyl)benzene and so forth.

Diamine component (a) for a diamine compound is usable in the present invention as a raw material by mixing one kind or at least two kinds of 4,4'-diamino diphenylmethane, 4,4'-diaminodiphenyl ether, 4,4'-diamino-3,3'-dimethyl diphenylmethane, 3,3'-dimethoxy-4,4'-diaminobiphenyl, 3,3'-dimethyl-4,4'-diaminobiphenyl, 2,2'-dichloro-4,4'-diamino-5,5'-dimethoxybiphenyl, 2,2',5,5'-tetrachloro-4,4'-diaminobiphenyl, 4,4'-methylene-bis(2-chloroaniline), 4,4'-diaminodiphenyl sulfone, 2,7-diaminofluorene, 4,4'-diamino-p-terphenyl, 1,3-diamino-5-cyanobenzene and so forth.

Diisocyanate component (b) is usable in the present invention by mixing one kind or at least two kinds of 4,4'-methylenediphenyl diisocyanate, 3,3'-dimethyldiphenyl-4,4'-diisocyanate, o-dianisidine diisocyanate, methylene bis(4-isocyanate-3-methylbenzene), methylene bis(4-isocyanate-2-methylbenzene), methylene bis(o-chlorophenyl isocyanato), 5-chloro-2,4-toluene diisocyanate, 4,4'-diphenylmethane diisocyanate (MDI), 2,4-toluene diisocyanate (2,4-TDI), 2,6-toluene diisocyanate (2,6-TDI), 3,5-diisocyanate benzotrifluoride, bis(4-isocyanate phenyl)ether, dicyclohexyl methane-4,4'-diisocyanate, norbornane diisocyanate methyl, p-phenylene diisocyanate, p-xylene diisocyanate, tetramethyl xylene diisocyanate, 1,5-naphthalene diisocyanate, 2,6-naphthalene diisocyanate, trans-1,4-cyclohexyl diisocyanate, isophorone diisocyanate, 1,3-bis(isocyanate methyl)benzene, and so forth.

A polyurea is provided as a preferable polyurea obtained from the following combination of (a)/(b).

Examples thereof include that 4,4'-diaminodiphenylmethane/3,3'-dimethyl diphenyl-4,4'-diisocyanate, 4,4'-diaminodiphenylmethane/o-dianisidine diisocyanate, 4,4'-diaminodiphenylmethane/methylene bis(4-isocyanate-2-methylbenzene), 4,4'-diamino diphenylmethane/4,4'-diphenylmethane diisocyanate (MDI), 4,4'-diaminodiphenylmethane/2,4-toluene diisocyanate (2,4-TDI), 4,4'-diamino diphenylmethane/2,6-toluene diisocyanate (2,6-TDI), 4,4'-diamino diphenylmethane/bis(4-isocyanato phenyl)ether, 4,4'-diamino diphenylmethane/p-phenylene diisocyanate, 4,4'-diamino diphenylmethane/1,5-naphthalene diisocyanate, 4,4'-diamino diphenyl ether/3,3'-dimethyl diphenyl-4,4'-diisocyanate, 4,4'-diaminodiphenyl ether/o-dianisidine diisocyanate, 4,4'-diaminodiphenyl ether/methylene bis(4-isocyanate-2-methylbenzene), 4,4'-diaminodiphenyl ether/4,4'-diphenylmethane diisocyanate (MDI), 4,4'-diaminodiphenyl ether/2,4-toluene diisocyanate (2,4-TDI), 4,4'-diaminodiphenyl ether/2,6-toluene diisocyanate (2,6-TDI), 4,4'-diaminodiphenyl ether/bis(4-isocyanato phenyl)ether, 4,4'-diaminodiphenyl ether/p-phenylene diisocyanate, 4,4'-diaminodiphenyl ether/1,5-naphthalene diisocyanate, 4,4'-diaminodiphenyl ether/1,3-bis (isocyanate methyl)benzene, 4,4'-diamino-3,3'-dimethyl diphenylmethane/3,3'-dimethyl diphenyl-4,4'-diisocyanate, 4,4'-diamino-3,3'-dimethyldiphenylmethane/o-dianisidine diisocyanate, 4,4'-diamino-3,3'-dimethyldiphenylmethane/methylene bis(4-isocyanate-2-methylbenzene), 4,4'-diamino-3,3'-dimethyldiphenylmethane/4,4'-diphenylmethane diisocyanate (MDI), 4,4'-diamino-3,3'-dimethyldiphenylmethane/2,4-toluene diisocyanate (2,4-TDI), 4,4'-diamino-3,3'-dimethyldiphenylmethane/2,6-toluene diisocyanate (2,6-TDI), 4,4'-diamino-3,3'-dimethyldiphenylmethane/bis(4-isocyanate phenyl)ether, 4,4'-diamino-3,3'-dimethyldiphenylmethane/p-phenylenediisocyanate, 4,4'-diamino-3,3'-dimethyldiphenylmethane/1,5-naphthalene diisocyanate, 3,3'-dimethoxy-4,4'-diaminobiphenyl/3,3'-dimethyldiphenyl-4,4'-diisocyanate, 3,3'-dimethoxy-4,4'-diaminobiphenyl/o-dianisidine diisocyanate, 3,3'-dimethoxy-4,4'-diaminobiphenyl/methylene bis(4-isocyanate-2-methylbenzene), 3,3'-dimethoxy-4,4'-diaminobiphenyl/4,4'-diphenylmethane diisocyanate (MDI), 3,3'-dimethoxy-4,4'-diaminobiphenyl/2,4-toluene diisocyanate (2,4-TDI), 3,3'-dimethoxy-4,4'-diaminobiphenyl/2,6-toluene diisocyanate (2,6-TDI), 3,3'-dimethoxy-4,4'-diaminobiphenyl/bis(4-isocyanate phenyl) ether, 3,3'-dimethoxy-4,4'-diaminobiphenyl/p-phenylene diisocyanate, 3,3'-dimethoxy-4,4'-diaminobiphenyl/1,5-naphthalene diisocyanate, 3,3'-dimethyl-4,4'-diaminobiphenyl/3,3'-dimethyldiphenyl-4,4'-diisocyanate, 3,3'-dimethyl-4,4'-diaminobiphenyl/o-dianisidine diisocyanate, 3,3'-dimethyl-4,4'-diaminobiphenyl/methylene bis(4-isocyanate-2-methylbenzene), 3,3'-dimethoxy-4,4'-diaminobiphenyl/4,4'-diphenylmethane diisocyanate (MDI), 3,3'-dimethyl-4,4'-diaminobiphenyl/2,4-toluene diisocyanate (2,4-TDI), 3,3'-dimethyl-4,4'-diaminobiphenyl/2,6-toluene diisocyanate (2,6-TDI), 3,3'-dimethyl-4,4'-diaminobiphenyl/bis(4-isocyanate phenyl)ether, 3,3'-dimethyl-4,4'-diaminobiphenyl/p-phenylene diisocyanate, 3,3'-dimethyl-4,4'-diaminobiphenyl/1,5-naphthalene diisocyanate, 4,4'-methylene-bis(2-chloroaniline)/3,3'-dimethyldiphenyl-4,4'-diisocyanate, 4,4'-methylene-bis(2-chloroaniline)/o-dianisidine diisocyanate, 4,4'-methylene-bis(2-chloroaniline)/methylene bis(4-isocyanate-2-methylbenzene), 4,4'-methylene bis(2-chloroaniline)/4,4'-diphenylmethane diisocyanate (MDI), 4,4'-methylene-bis(2-chloroaniline)/2,4-toluene diisocyanate (2,4-TDI), 4,4'-methylene-bis(2-chloroaniline)/2,6-toluene diisocyanate (2,6-TDI), 4,4'-methylene-bis(2-chloroaniline)/bis(4-isocyanate phenyl)ether, 4,4'-methylene-bis(2-chloroaniline)/p-phenylene diisocyanate, 4,4'-methylene-bis(2-chloroaniline)/1,5-naphthalene diisocyanate, and 1,3-diamino-5-cyanobenzene/2,6-naphthalene diisocyanate.

In order to polymerize the foregoing previously synthesized resin (prepolymer) of the present invention, it is desired to conduct a polymerizing treatment at not higher than 60° C., and preferably at 5-35° C. The low temperature is accepted since the high polymerization degree is not preferred, but in the case of the temperature being too low, it is not preferred that a cooling system and electric power consumed by the cooling system are necessary. In the case of a temperature of at least 60° C., it is not also preferred that coating becomes difficult since polymerization is progressed, and viscosity is increased, whereby dissolved solvents are to be limited. Reaction time, depending on the reaction amount and temperature, should be adjusted appropriately, but the shorter reaction time is preferable in view of productivity. The efficiency of a poling treatment can be raised by polymerizing while conducting the poling treatment. Polymerizing a resin while conducting a poling treatment is more preferable than polymerizing the resin and subsequently conducting a poling treatment.

In the case of polyamide, polyamide having a low polymerization degree is employed in advance as the previously synthesized resin (prepolymer). Conventionally, polyamide is obtained via reaction of diamine with dicarboxylic acid, but a method of condensing the dicarboxylic acid as acid chloride is more preferable than a method of employing cyclic caprolactam. Examples of the typical polyamide include polyamide 6, polyamide 66, polyamide 610, polyamide 612, polyamide 11, polyamide 12, polyamide MXD6 and polyamide 46. Examples of polyester include polyethylene terephthalate, polyethylene naphthalate and so forth. An imide compound is a condensation product of acid anhydride with a diamine compound, and is synthesized from the following amine compounds and acid anhydride compounds. Examples of the preferable diamine compound include ethylene diamine, propylene diamine, trimethylene diamine, diethylene triamine, triethylene tetramine, hexamethylene diamine, heptamethylene diamine, octamethylene diamine, nonamethylene diamine, decamethylene diamine, 1,12-dodecane diamine, 1,18-octadecane diamine, 3-methylheptamethylene diamine, 4,4-dimethylheptamethylene diamine, 4-methylnonamethylene diamine, 5-methylnonamethylene diamine, 2,5-dimethylhexamethylne diamine, 2,5-dimethylheptamethylne diamine, 2,2-dimethylpropylene diamine, N-methyl-bis(3-aminopropyl)amine, 3-methoxyhexamethylene diamine, 1,2-bis(3-aminopropoxy)ethane, bis(3-aminopropyl)sulfide, 1,4-cyclohexane diamine, bis-(4-aminocyclohexyl)methane, m-phenylene diamine, p-phenylene diamine, 2,4-diaminotoluene, 2,6-diaminotoluene, m-xylylene diamine, p-xylylene diamine, 2-methyl-4,6-diethyl-1,3-phenylene-diamine, 5-methyl-4,6-diethyl-1,3-phenylene-diamine and so forth. Specific examples of the preferable acid anhydride include 2,2-bis[4-(3,4-dicarboxyphenoxy)phenyl]propane dianhydride, 4,4'-bis(3,4-dicarboxyphenoxy)diphenylether dianhydride, 4,4'-bis(3,4-dicarboxyphenoxy)diphenylsulfide dianhydride, 4,4'-bis(3,4-dicarboxyphenoxy)benzophenone dianhydride, 4,4'-bis(3,4-dicarboxyphenoxy)diphenylsulfone dianhydride, 2,2-bis[4-(2,3-dicarboxyphenoxy)phenyl]propane dianhydride, 4,4'-bis(2,3-dicarboxyphenoxy)diphenylether dianhydride and so forth. Preferred is the previously synthesized resin (prepolymer) of the present invention having a polymerization degree of 4-300, but the previously synthesized resin having a polymerization degree of 300 or more is not preferable in view of increased viscosity, coatability and a poling treatment. A dc square wave, a dc pulse wave and so forth can be selected for a poling treatment. The resin temperature applied during the poling treatment is preferably in the neighborhood of the glass transition point, but the temperature may be varied when the temperature is the melting point or lower. Since in the case of the temperature higher than the glass transition point, the poling treatment is carried out for a short period of time, and in the case of the temperature lower than the glass transition point, the poling treatment is also carried out for a long period of time, temperature and time should be selected appropriately.

An urea resin (prepolymer) having a polymerization degree of 4-300 can be obtained via reaction of an amine compound with an isocyanate compound in no solvent or in a solvent. Since the urea resin having a polymerization degree exceeding 100 exhibits high viscosity, the reaction in an organic solvent becomes also available.

Examples of organic solvents usable in the present invention include ester based solvents such as ethylene glycol diethyl ester and so forth; and glycol ether based solvents such as methylcellosolve, cellosolve, butylcellosolve, isobutylcellosolve, t-butylcellosolve, isopropylcellosolve, hexylcellosolve, methoxybutanol, 3-methyl-3-methoxybutanol, methylcarbitol, carbitol, butylcarbitol, propylene glycol monomethylether, dipropylene glycol monomethylether, methyl glycol acetate, cellosolve acetate, a butyl glycol acetate, methoxypropyl acetate, methoxybutyl acetate, carbitol acetate, butyl acetate carbitol, SOLFIT acetate and so forth.

The final number average molecular weight after conducting a poling treatment for a urea resin obtained via a method of forming a piezoelectric resin film of the present invention is preferably 10,000-100,000 in view of durability, and more preferably 20,000-60,000. The number average molecular weight is a molecular weight represented by a value measured via gel permeation chromatography (GPC), and the numeric value is designated as a polystyrene conversion value.

Further, the temperature applied during the poling treatment is 70-250° C. In the case of 70° C. or higher, molecular motion is preferably in a suitable state for polarization. In the case of 250° C. or lower, it is also preferable that controlled molecular arrangement is not disarranged once again.

It is safe to remove volatile components of a solvent in order to avoid fire and explosion hazard during a corona discharge treatment employing the solvent, when a polyurea resin prepolymer is synthesized.

A commercially available corona discharge generator is usable for a corona discharge treatment utilized for a poling treatment of the present invention. The discharge treatment conditions are preferred to be selected appropriately since the conditions depend on utilized apparatuses. The corona discharge treatment comprises an electric power source supplying portion in which a high voltage dc current is generated and a pulse forming portion in which the high voltage dc current is converted to a high voltage pulse, and preferable is a corona discharge treatment apparatus equipped with a power supply in which a voltage pulse having a peak value of 1-100 kV, a pulse width of 100 msec-1 psec, a pulse frequency of 10-1000 pps is generated. An alternating current of an ac power supply having a frequency of 50/60 Hz is converted into a direct current, and a power supply portion in which a high-voltage direct current is generated by a step-up transformer and a pulse forming portion in which the resulting high-voltage direct current is converted into a high-voltage pulse via a pulse forming circuit employing a commonly known blowing type gap switch are, for example, placed to generate the voltage pulse. Generally, when an electrode spacing is broadened to a level of several centimeters, a high voltage of at least several 100 kV has to be applied to generate corona discharge, but arc discharge in which discharge is concentrated in a single center is possibly generated in the case of application of such the high voltage. The high-voltage pulse generating no arc discharge is effective since it is capable of conducting a corona discharge treatment evenly and stably. A peak value of this high-voltage pulse is preferably 1-100 kV, a pulse width of 100 msec-700 nsec is practically preferable, and a pulse frequency of 1-1000 pps is practically preferable though the higher the pulse frequency, the more the treatment efficiency is improved. A corona discharge density is preferably 10 mW/m$^2$-100 W/m$^2$, and more preferably 100 mW/m$^2$-50 W/m$^2$.

Substrates employed in the present invention depend on how to use piezoelectric resins. As for a multilayer obtained by laminating piezoelectric elements, there is a method of laminating the organic piezoelectric element of the present invention via an electrode on a ceramic piezoelectric element. As the ceramic piezoelectric element, PZT is frequently is employed, but it has recently been recommended to employ one containing no lead. PZT represented by $Pb(Zr_{1-x}Ti_x)O_3$ within the range of $0.47 \leq x \leq 1$ is frequently is preferable, but examples of the material containing no lead include a natural or synthetic quartz, lithium niobate ($LiNbO_3$), potassium niobate tantalate [K(Ta, Nb)$O_3$], barium titanate ($BaTiO_3$), lithium tantalite ($LiTaO_3$), strontium titanate ($srTiO_3$) and so forth. Compositions of various ceramic materials can be selected appropriately for performance in use.

EXAMPLE

Next, the present invention will now be described in detail referring to examples, however, the present invention is not limited thereto.

An example relating to formation of a piezoelectric urea resin film will be described.

Example 1

Synthesis of Prepolymer

Twenty nine grams (0.1 mole) of 3,3'-dimethyldiphenyl-4,4'-diisocyanate and 24 g (0.1 mole) 3,3'-dimethyldiphenyl-4,4'-diamine in a 500 ml flask equipped with a thermal control unit were weighed, and mixed at 5° C. for 10 minutes while stirring at 122 rpm/min to synthesize a prepolymer. Then, the molecular weight measurement was conducted employing GPC(HLC-8220GPC, manufactured by Tosoh Corporation). A molecular weight of 11,700 and a polymerization degree of 22 were obtained in the case of polymer-1 sample. A polymerization degree of 41 (polymer-2), a polymerization degree of 63 (polymer-3), a polymerization degree of 94 (polymer-4), a polymerization degree of 224 (polymer-5) and a polymerization degree of 360 (polymer-6) were obtained, when polymerization was conducted by changing the temperature and setting it to 10° C., 20° C., 40° C., 60° C. and 70° C., respectively.

<<Coating a Prepolymer onto a PZT Film, and a Poling Treatment>>

The foregoing prepolymers (polymer-1-polymer-5) each were dissolved in a 10% by weight dimethylformamide solution, and the resulting was coated onto a PZT film fitted with an electrode so as to give a dry thickness of 30 μm. Polymer-6 was removed since it is not dissolved, and has high viscosity. Absorption of the formed urea bond was detected in the neighborhood of 1650±2 cm$^{-1}$ from each infrared absorption spectrum of the resulting urea resin film, and it was confirmed that the formed film was composed of polyurea.

A discharge poling treatment was conducted onto this urea resin film at a corona discharge density of 2 W/m$^2$ at 180° C. for 10 minutes employing HV2010 manufactured by Tantec EST Inc.

<<Evaluation Method>>

The piezoelectric resistance test of piezoelectric elements formed by the method of the present invention was conducted employing an acoustic intensity measurement system Model 805 (1-50 MHz) of an ultrasound testing device (manufactured by Sonora Medical Systems, Inc.: 2021 Miller Drive Longmont, Colo. 0501 USA) to observe transmitting and receiving waveforms. A pulse voltage was applied to both end faces of a PZT film for transmission, and a voltage signal at both ends of the resin film was read out for reception to make evaluation of performance. (Pulse voltage: 4 V and opening area: 3 cm$^2$) The results are shown in Table 1.

TABLE 1

| | Prepolymer synthesis temperature ° C. | Polymerization degree | Voltage signal for reception mV | Polymerization degree after poling treatment |
|---|---|---|---|---|
| Prepolymer 1 | 5 | 22 | 5.2 | 100-130 |
| Prepolymer 2 | 10 | 41 | 5.1 | 100-130 |
| Prepolymer 3 | 20 | 63 | 5.0 | 100-130 |
| Prepolymer 4 | 40 | 94 | 5.1 | 100-130 |
| Prepolymer 5 | 60 | 224 | 5.1 | 250-280 |
| Prepolymer 6 | 70 | 360 | — | — |
| Comparative | — | — | 42 | — |

By way of comparison, 29 g (0.1 mole) of 3,3'-dimethyldiphenyl-4,4'-diisocyanate and 24 g (0.1 mole) 3,3'-dimethyldiphenyl-4,4'-diamine were weighed, and both compounds were placed in a vacuum evaporation polymerization apparatus to conduct evaporation polymerization so as to give a thickness of 30 μm deposited on a PZT substrate. A poling treatment was subsequently conducted under the foregoing condition to evaluate performance. In this case, a voltage signal of 4.2 mV were obtained employing an oscilloscope.

The resin after the poling treatment was peeled off the substrate to conduct GPC measurement. A polymerization degree of 100-130 was obtained for prepolymer-1-prepolymer-4 via the GPC measurement, and a polymerization degree of 250-280 was obtained for prepolymer-5.

It is to be understood that sufficient reception signal intensity can be obtained via the method of forming a piezoelectric resin film of the present invention.

Example 2

Signal intensities were measured employing prepolymer-2 in the same manner as in Example 1, except that the corona discharge density during corona discharge treatment was varied.

TABLE 2

| | Corona discharge density W | Voltage signal for reception mV |
|---|---|---|
| Prepolymer 2 | 0.01 | 2.1 |
| Prepolymer 2 | 1 | 5.1 |
| Prepolymer 2 | 2 | 5.1 |
| Prepolymer 2 | 4 | 5.2 |

TABLE 2-continued

| | Corona discharge density W | Voltage signal for reception mV |
|---|---|---|
| Prepolymer 2 | 8 | 5.3 |
| Prepolymer 2 | 45 | 5.2 |
| Prepolymer 2 | 60 | 4.9 |

It is to be understood that sufficient reception signal intensity can be obtained in the case of selecting the corona discharge density appropriately.

Example 3

Reception signal intensities were also measured employing prepolymer-2 in the same manner as in Example 1, except that a corona discharge treatment was replaced by a poling treatment conducted by applying a dc pulse voltage. A silver electrode was first attached on a PZT substrate having a square, 20 mm on a side, prepolymer-2 was subsequently coated thereon, and a silver electrode was further attached thereon so as to give a thickness of 32 μm. A poling treatment with 120 V together with a pulse width of 100 μsec and a pulse interval of 10 msec obtained via this electrode was also conducted. The poling treatments each were conducted at 80° C. for 21 minutes, 100° C. for 17 minutes, 120° C. for 12 minutes and 140° C. for 8 minutes, and any of the resulting signal intensities corresponding to the temperature and time conditions were within the range of 4.9-5.2 mV.

It is to be understood that sufficient reception signal intensity can also be obtained in the case of a poling treatment conducted by applying a dc pulse voltage.

Example 4

Preferable examples as the condensation product of acid anhydride with diamine are specifically shown below. These can be synthesized referring to a synthesis method described in U.S. Pat. No. 4,455,410.

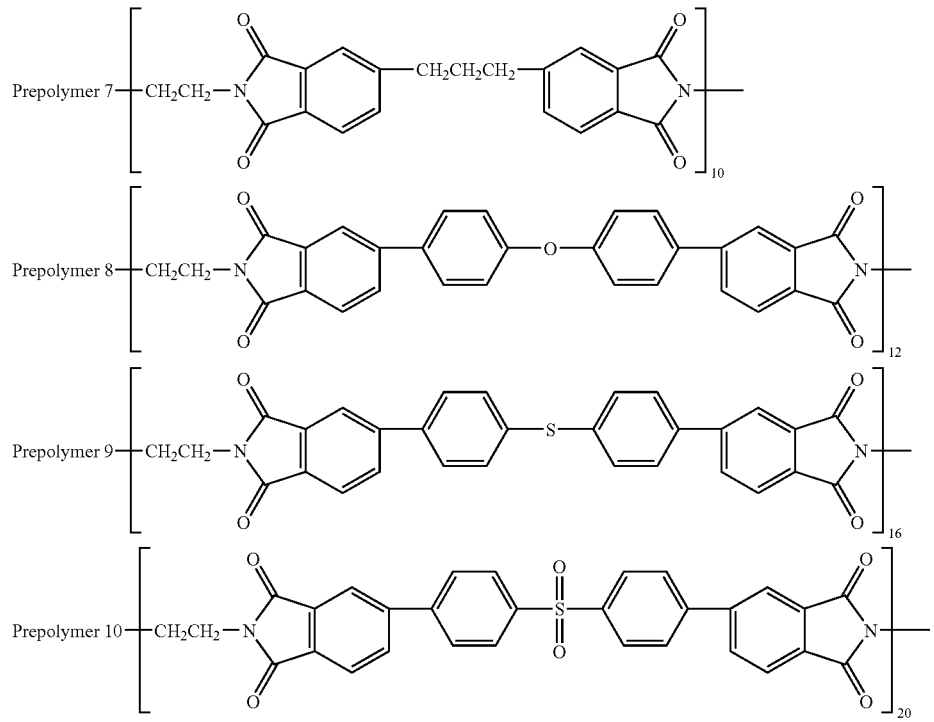

Here, samples were prepared similarly to Example 1, and a polyimide bond-containing compound was employed as each of prepolymer 7, prepolymer 8, prepolymer 9 and prepolymer 10 for coating so as to give a dry thickness of 50 μm. An applied DC pulse voltage was 6 kV. The resulting signal intensities for reception were 4.6, 4.7, 4.5 and 4.8 mV, respectively. It is to be understood that these polyimide compounds also exhibit sufficient sensitivity.

Example 5

In addition, samples were prepared similarly to Example 4, employing polyamide 6, polyamide 12 and polyethylene terephthalate, and coating was carried out so as to give a dry thickness of 50 μm. An applied DC pulse voltage was 6 kV. The resulting signal intensities for reception were 4.6, 4.7, and 4.5 mV, respectively. It is to be understood that these polyamide-containing compounds and polyester-containing compounds also exhibit sufficient sensitivity.

EFFECT OF THE INVENTION

The present invention can provide a method of forming a piezoelectric resin film produced at low cost, and specifically provide the method in which a large-area piezoelectric resin film is produced at low cost, and at reduced investment in facilities.

What is claimed is:

1. A method of forming a piezoelectric resin film for ultrasound transmission and reception comprising the steps of:
   (a) polymerizing a monomer at a temperature of 5-60° C. to obtain a resin having (i) a polymerization degree of 4-300, and (ii) a polarity group comprising a urea bond, thereafter
   (b) coating the resin onto a substrate via a liquid coating process; and, thereafter
   (c) further polymerizing the resin at 70-250° C. while conducting a poling treatment applied to the resin to form the piezoelectric resin film for ultrasound transmission and reception on the substrate.

2. The method of claim 1,
   wherein the monomer is a diisocyanate compound, or a mixture of a diisocyanate compound and a diamine compound.

3. The method of claim 1,
   wherein the poling treatment is a dc pulse discharge treatment or a high-voltage corona discharge treatment.

4. The method of claim 1,
   wherein the substrate is a piezoelectric ceramic plate.

* * * * *